(12) United States Patent
Wieczorek et al.

(10) Patent No.: US 6,566,718 B2
(45) Date of Patent: May 20, 2003

(54) FIELD EFFECT TRANSISTOR WITH AN IMPROVED GATE CONTACT AND METHOD OF FABRICATING THE SAME

(75) Inventors: Karsten Wieczorek, Reichenberg-Boxdorf (DE); Rolf Stephan, Dresden (DE); Manfred Horstmann, Dresden (DE); Stephan Kruegel, Boxdorf (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/848,085

(22) Filed: May 3, 2001

(65) Prior Publication Data

US 2002/0056879 A1 May 16, 2002

(30) Foreign Application Priority Data

Nov. 16, 2000 (DE) .......................................... 100 56 871

(51) Int. Cl.[7] .......................... H01L 29/76; H01L 29/94; H01L 31/062; H01L 31/113; H01L 31/119
(52) U.S. Cl. .......................... 257/368; 257/388; 257/412
(58) Field of Search .................................. 257/368, 388, 257/412

(56) References Cited

U.S. PATENT DOCUMENTS

| 5,563,439 | A | * | 10/1996 | Chung et al. | ................ | 257/368 |
| 5,789,791 | A | * | 8/1998 | Bergemont | .................. | 257/401 |
| 5,955,759 | A | * | 9/1999 | Ismail et al. | ................. | 257/332 |
| 5,982,001 | A | * | 11/1999 | Wu | ............................ | 257/412 |
| 6,218,690 | B1 | * | 4/2001 | Kim et al. | ................... | 257/388 |

* cited by examiner

*Primary Examiner*—David Nelms
*Assistant Examiner*—Andy Huynh
(74) *Attorney, Agent, or Firm*—Williams, Morgan & Amerson, P.C.

(57) ABSTRACT

A field effect transistor comprises a gate electrode contact of a highly conductive material that contacts the gate electrode and extends in the transistor width dimension at least along a portion of the channel. Thus, the gate resistance and the gate signal propagation time for a voltage applied to the gate contact is significantly reduced even for devices with an extremely down scaled gate length. Moreover, a method for fabricating the above FET is disclosed.

32 Claims, 5 Drawing Sheets

FIELD EFFECT TRANSISTOR WITH AN IMPROVED GATE CONTACT AND METHOD OF FABRICATING THE SAME

BACKGROUND OF THE INVENTION

1. Field of the Invention

The present invention relates to VLSI semiconductor devices and, particularly to the formation of a gate electrode of a field effect transistor (FET) having a reduced signal propagation time at the gate electrode.

2. Description of the Related Art

The manufacturing process of integrated circuits (ICs) involves the fabrication of numerous semiconductor devices, such as insulated gate field effect transistors, on a single substrate. In order to provide increased integration density and improved device performance, for instance with respect to signal processing time and power consumption, feature sizes of the semiconductor devices are steadily decreasing. In general, decreasing features sizes of an FET provide a variety of advantages, such as high package density and small rise and fall times during switching of the transistors due to the reduced channel length. On the other hand, the reduced gate length of the FET may lead to certain disadvantages that offset the advantage associated with the smaller channel length, since the gate resistance and, thus, signal delay of the gate electrode increases as the gate length decreases.

To clearly demonstrate the problems involved with steadily decreasing feature sizes of modem ultra-high density integrated circuits, a typical prior art process flow will be described with reference to FIGS. 1a–1d, in which particularly the problems involved with the formation of the gate electrode and the gate electrode contact are detailed. As the skilled person will readily appreciate, the figures depicting the prior art processing are merely of a schematic nature, and transitions and boundaries illustrated as sharp lines may not be imparted as sharp transitions in a real device. Furthermore, the description of the typical prior art process refers to standard manufacturing procedures without specifying typical process parameter values used for these procedures, since individual processing steps may be accordingly adapted to meet specific design requirements.

FIG. 1a shows a schematic cross-sectional view of an FET device at a specific manufacturing stage. In a semiconductor substrate 101, such as a silicon substrate, a transistor active region comprising drain and source regions 105 separated by a channel 108 is defined by shallow trench isolations 102. Over the channel 108, a gate electrode 104 is formed and separated from the channel by a gate insulation layer 103. The sidewalls of the gate electrode 104 are covered by sidewall spacers 107. On top of the drain and source regions 105 and the gate electrode 104, cobalt silicide portions 106 are provided. The drain and source regions 105 and the gate electrode 104 extend substantially in a parallel manner along a transistor width direction which is perpendicular to the drawing plane of FIG. 1a. In FIG. 1a, the horizontal direction is referred to as the "transistor length dimension," and the lateral extension of the gate electrode 104 is called the "gate length."

As the skilled person will readily appreciate, formation of the structure shown in FIG. 1a may comprise the following steps: forming the shallow trench isolations 102 which consist of, for example, silicon dioxide, depositing or growing a gate insulation layer, depositing a gate electrode material, such as polycrystalline silicon, and patterning the gate electrode material by, for instance, deep ultraviolet photolithography and etching, creating lightly doped drain and source regions and lightly doped out-diffused regions by ion implantation and subsequent rapid thermal annealing, forming the sidewall spacers 107 to subsequently perform a further implantation step to obtain the drain and source regions 105, and depositing a metal, such as cobalt, to initiate a chemical reaction between the silicon surfaces of the drain and source regions 105 and the gate electrode 104. The thereby obtained silicide portions 106 exhibit a sheet resistance of about 10 ohm/square.

FIG. 1b schematically shows a cross-sectional view of the device of FIG. 1a in an advanced manufacturing stage. In a dielectric layer 109 having a planarized surface, drain and source contacts 110 are formed which are partially in contact with the drain and source regions 105, respectively, via cobalt silicide portions 106. The drain and source contacts 110 comprise a barrier layer 111 in contact with the dielectric layer 109 and the silicide portions 106 of the drain and source regions 105. Typically, formation of the structure shown in FIG. 1b is accomplished by depositing a dielectric material, such as silicon dioxide, and polishing back the deposited material to yield a planar surface. Thereafter, contact openings are patterned, etched and subsequently filled with a barrier metal forming the barrier layer 111 and a contact metal such as tungsten. Next, the excess metal is removed by chemical mechanical polishing, as is well known in the art, to thereby obtain drain and source contacts 110.

FIG. 1c schematically shows the device of FIGS. 1a and 1b in a final stage. In a second dielectric layer 113, openings are formed which are filled with a second metal, such as aluminum, for providing metal lines 114. The second dielectric layer 113 may be comprised of silicon dioxide or an appropriate dielectric material having a low dielectric constant.

FIG. 1d schematically shows a top view of the device of FIG. 1c, wherein, for the sake of simplicity, the metal lines 114, the second dielectric layer 113, the dielectric layer 109, and the silicide portions 106 are not shown. In FIG. 1d, the drain region and the source region, respectively, are contacted by three contacts 110, whereas the gate electrode 104 is connected to two gate electrode contacts 112 that are located outside the transistor active region. From FIG. 1d it is obvious that a gate voltage applied to the contacts 112 is supplied to the gate electrode via the relatively high-ohmic silicide portion 106 of the gate electrode. Hence, the creation of a conductive channel between the drain region and the source region, in case of an enhancement type FET, upon applying a voltage to the gate contacts 112 is significantly delayed due to the high gate resistance. This situation becomes even worse when the size of the gate electrode, e.g., the gate length, is reduced, as required for optimization of the DC properties of the transistor, since the reduced gate cross-section further increases the gate resistance, and thus partially offsets the advantage obtained by the reduced channel length. Accordingly, improved DC transistor characteristics obtained by a reduced channel length do not necessarily result in a corresponding improved AC performance of the transistor.

In view of the above, there exists a need for an improved FET device having lower gate delay to enhance the AC performance of the transistor.

SUMMARY OF THE INVENTION

According to one aspect of the present invention, a field effect transistor formed on a substrate comprises a drain region and a source region, spaced apart from each other in a transistor length dimension by a channel region, a gate electrode formed over the channel and insulated therefrom by a gate insulation layer, the drain region, the source region, and the gate electrode extending substantially in a parallel manner along a transistor width dimension. The field effect transistor further comprises a drain contact at least partially formed over the drain region and comprising a metal, wherein the drain contact connects the drain region to a drain metallization line, a source contact at least partially formed over the source region and comprising a metal, the source contact connecting the source region to a source metallization line, and a gate contact at least partially formed over and in contact with the gate electrode and comprising an electrically conductive material, wherein the gate contact has a width extension along the gate electrode in the transistor width dimension that covers the gate electrode at least along a portion of the channel region, thereby providing a reduced gate electrode resistance.

The transistor device in accordance with the present invention has a gate contact that is at least partially formed over the channel of the transistor. Accordingly, due to the significantly increased cross-section of electric conductive material, the resulting electrical resistance of the gate electrode is significantly reduced when compared to a prior art device in which polysilicon end caps are formed outside of the transistor active region. Thus, a transistor device in accordance with the present invention drastically reduces signal delay, and hence contributes to an improved AC performance of the transistor device as required in modern integrated circuits, such as microprocessors and the like, where the field effect transistors are operated at clock frequencies of 1 GHz and higher.

In a further embodiment, the gate contact extends along the entire width of the channel so that signal propagation time at the gate electrode is decreased even more. Moreover, the gate electrode contact may additionally comprise a gate metallization line that is formed over the gate contact, which additionally reduces the effective gate electrode resistance. The length dimension of the gate contact and/or the gate metallization line may exceed the length of the gate electrode so as to obtain a large, effective cross-section for charge carrier transportation along the width direction of the gate electrode, thereby further decreasing the effective electrical resistance.

According to another aspect of the present invention, a method of forming a transistor having a length direction and a width direction comprises forming a gate insulation layer above an active region of a semiconducting substrate, forming a gate electrode above the gate insulation layer, and forming a source region and a drain region in the active region adjacent the gate electrode. The method further comprises forming a gate contact above the gate electrode, wherein the gate contact is electrically coupled to the gate electrode and extends, in a transistor width direction, above at least a portion of the active region.

The method according to the present invention allows the formation of a field effect transistor having the advantages as pointed out above. Moreover, the process steps involved in performing the method are compatible with standard semiconductor manufacturing procedures so that the method may be implemented in a process line without undue re-organization of the process flow.

BRIEF DESCRIPTION OF THE DRAWINGS

The invention may be understood by reference to the following description taken in conjunction with the accompanying drawings, in which like reference numerals identify like elements, and in which.

Figure 1A:
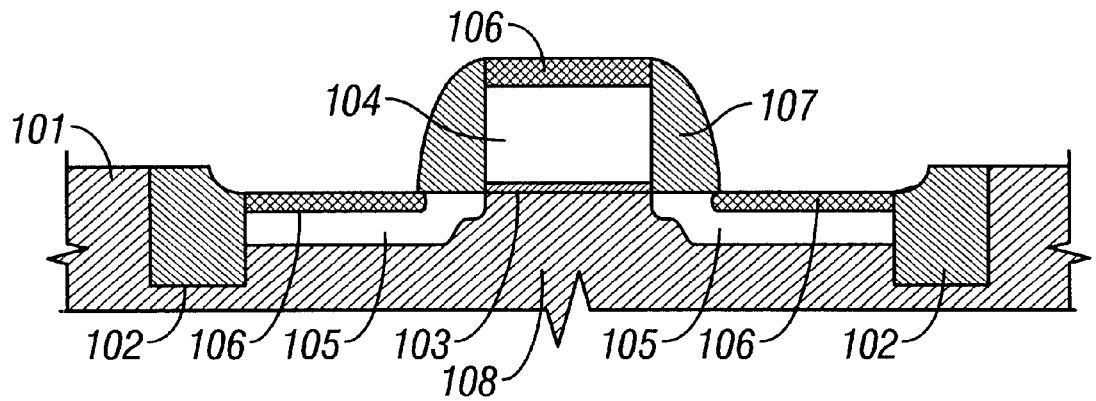
FIG. 1a schematically shows a cross-section of a typical prior art FET device at a specific manufacturing stage.
Figure 1B:
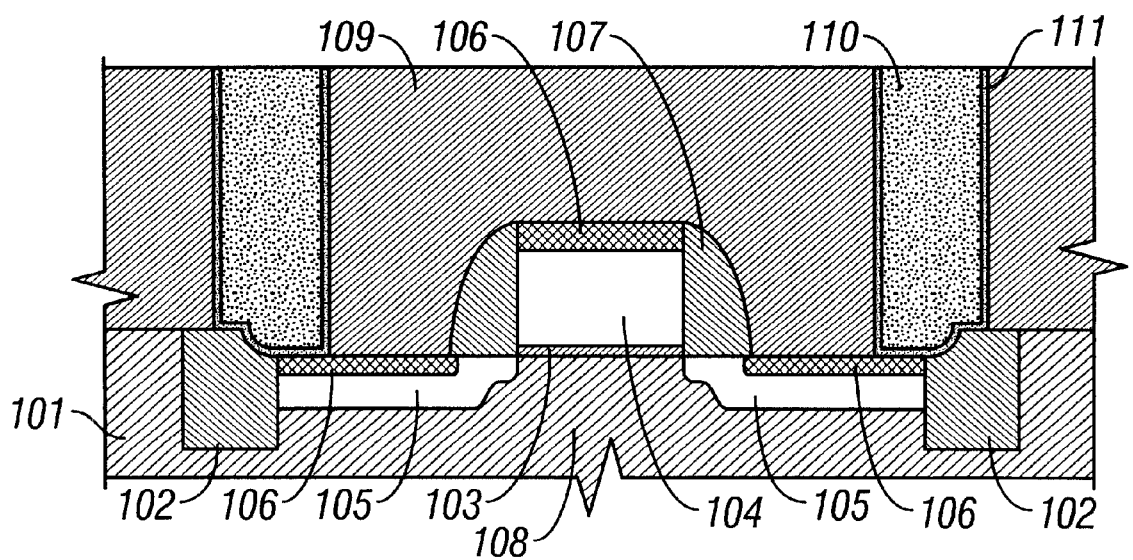
FIG. 1b schematically shows a cross-section of the FET device of FIG. 1a at an advanced manufacturing stage.
Figure 1C:
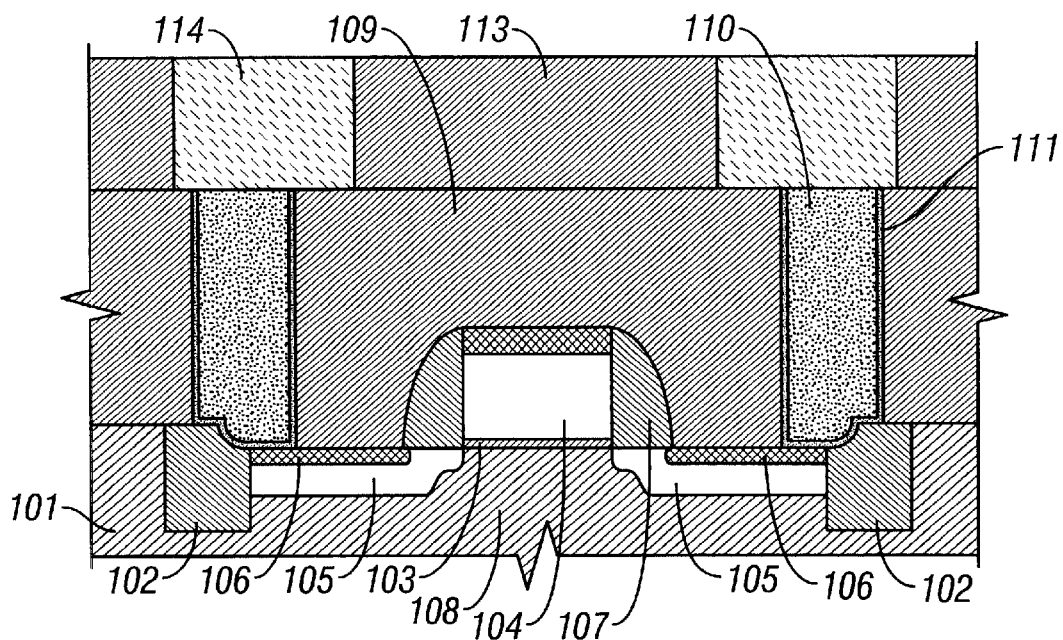
FIG. 1c schematically shows a cross-section of the complete FET device with a first metallization layer.
Figure 1D:
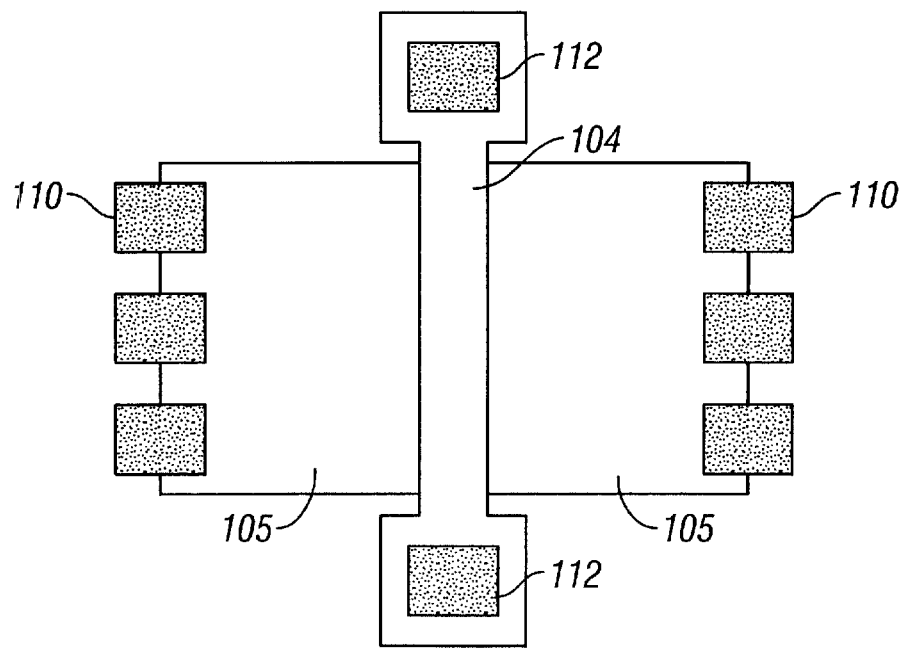
FIG. 1d schematically shows a top view of the device of FIG. 1c, wherein drain, source, and gate contacts are illustrated.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 2A:
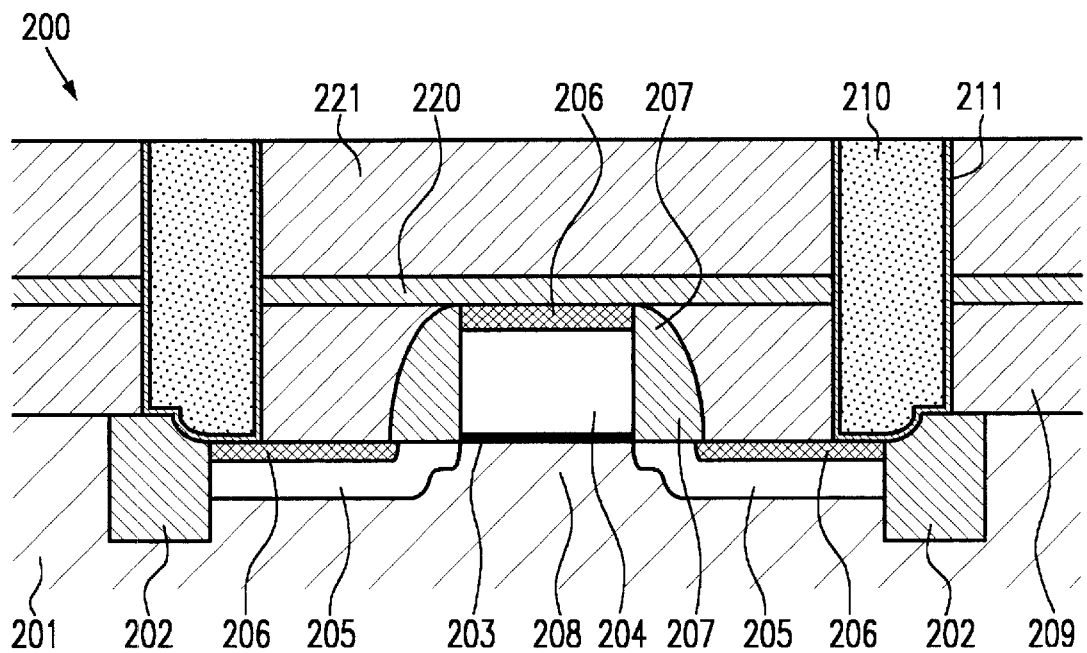
FIG. 2a schematically shows a cross-section of an FET device in accordance with the present invention at a specific manufacturing stage, FIG. 2b schematically shows a cross-section of the device of FIG. 2a at an advanced manufacturing stage.

FIG. 2a schematically shows a cross-section of a field effect transistor 200 at a specific manufacturing stage in accordance with the present invention. In FIG. 2a, shallow trench isolations 202, formed in a substrate 201 which may be an appropriate semiconductor substrate or an insulating substrate, such as glass and the like, define an active region of the transistor 200. In the active region, a drain and a source region 205 are separated by a channel 208. Over the channel 208, a gate electrode 204 is formed and spaced apart from the channel 208 by a gate insulation layer 203. The sidewalls of the gate electrode 204 are covered by sidewall spacers 207 which consist of a dielectric material. A dielectric layer 209, a first etch stop layer 220, and a further dielectric layer 221 electrically isolate drain and source contacts 210 from each other and from the gate electrode 204. The first etch stop layer 220 and the further dielectric layer 221 are also referred to as a "first dielectric layer stack." The drain and source contacts 210 comprise a barrier layer 211 at the interface to the adjacent materials. The surface portions of the drain region, the source region, and the gate electrode comprise portions 206 of increased electrical conductivity. These portions 206 are typically comprised of a metal silicide, such as cobalt silicide.

A typical process flow for forming the structure depicted in FIG. 2a may include the following steps. The shallow trench isolations 202, the gate insulation layer 203, and the gate electrode 204 are formed in accordance with standard manufacturing procedures as are well known in the art. The drain and source regions 205 are formed by a first ion implantation followed by a rapid thermal annealing and a second ion implantation after sidewall spacer formation so as to obtain the final drain and source regions having lightly doped areas and out-diffused areas which are not shown in the figures. Silicide processing is performed, for example by using cobalt, so as to generate the portions 206 of increased electrical conductivity. Thereafter, a dielectric material layer, for example comprising silicon dioxide, is deposited over the structure and, contrary to the typical prior art processing, is polished until the surface of the gate electrode 204 is exposed to obtain the dielectric layer 209 with a planar surface. Next, the first dielectric layer stack comprising the first etch stop layer 220, which may be comprised of silicon nitride, and the dielectric layer 221, which, for example, is comprised of silicon dioxide, is deposited over the planarized surface of the dielectric layer 209 and the exposed surface of the gate electrode 204. In a further step, openings are formed in the first dielectric layer stack and the dielectric layer 209, which are then filled with a contact metal to form the drain and source contacts 210. Prior to filling the openings with the contact metal, a barrier layer 211 is formed on the surface of the openings for providing sufficient adhesion of the contact metal to be filled in and for avoiding out-diffusing of the contact metal into the adjacent dielectric materials. In the present embodiment, tungsten is used as a contact metal, however any other appropriate metal such as aluminum, titanium, tantalum, cobalt, copper, and the like, or any combination thereof, may be selected. After filling the openings for forming the drain and source contacts 210, excess material of the contact metal is removed by CMP and a planarized surface is obtained.

Figure 2B:
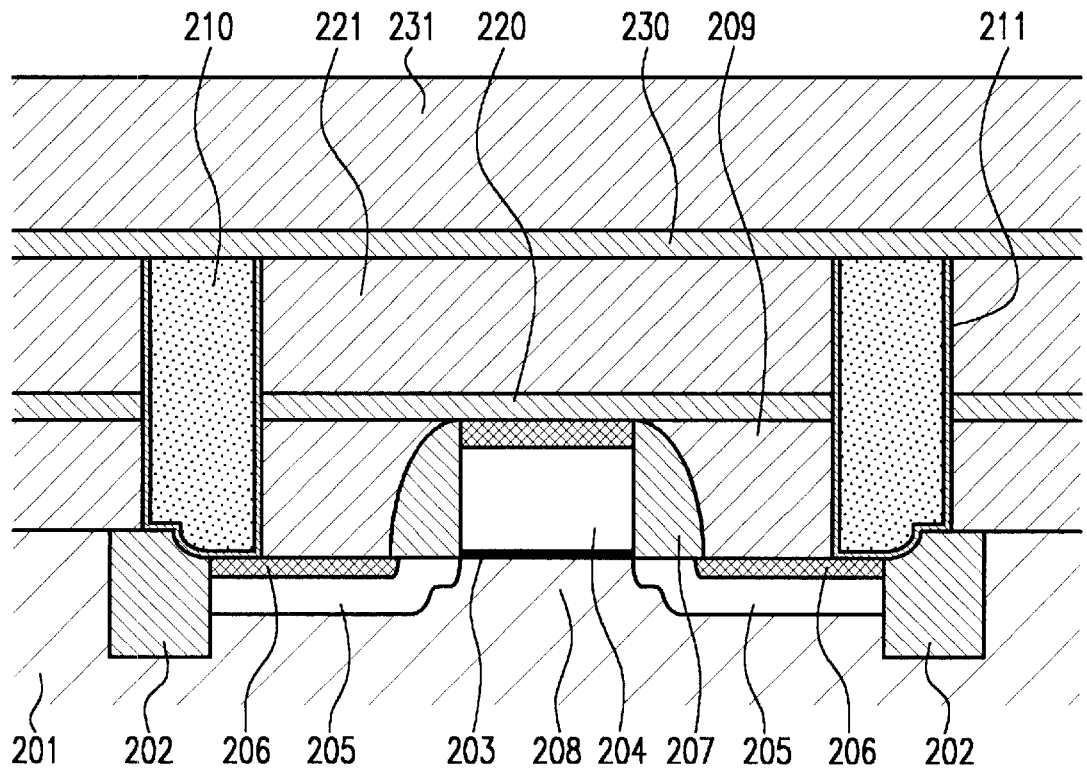
FIG. 2c shows a cross-section of the FET device of FIG. 2b prior to forming a gate contact.
FIG. 2d schematically shows a cross-section of the final FET device illustrated in FIGS. 2a–2c, wherein a gate contact and a metallization layer is formed.
FIG. 2e schematically shows a top view of the FET device of FIG. 2d.

FIG. 2b schematically shows a cross-section of the transistor 200 in an advanced manufacturing stage. Over the planarized surface of the first dielectric layer stack, a second dielectric layer stack is formed that includes a second etch stop layer 230, for example comprising silicon nitride, and a further dielectric layer 231, for example comprising silicon dioxide. For high-speed applications and in ultra high-density integrated circuits, the dielectric layer 231 may preferably be formed of a material having a low dielectric constant k. In this case, the dielectric constant k is preferably equal to or less than 4.0. A dielectric constant k of 4.0 or less will significantly reduce the parasitic capacitance between the metallization lines to be formed in the second dielectric layer stack. Materials that may be used for the dielectric layer 231 include, but are not limited to, FTEOS, SiCOH, SILC.

Figure 2C:
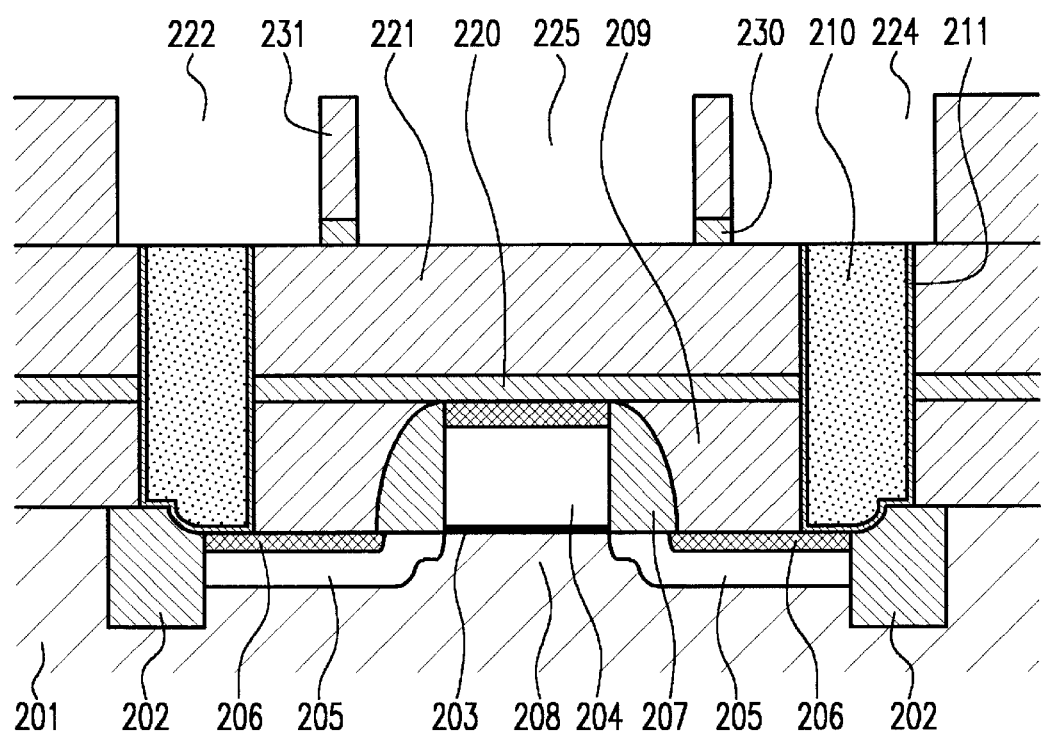

FIG. 2c schematically shows a cross-section of the device of FIG. 2b, wherein a drain contact opening 222, a source contact opening 224 over the drain and source contacts 210, respectively, and a gate contact opening 225 over the gate electrode 204 are formed in the second dielectric layer stack. As illustrated in FIG. 2c, the length dimension of the gate contact opening 225 exceeds the length of the gate electrode 204. This feature facilitates alignment during patterning of the second dielectric layer stack and additionally insures an increased cross-section of the gate contact to be formed, which results in a low electrical resistance.

Figure 2D:
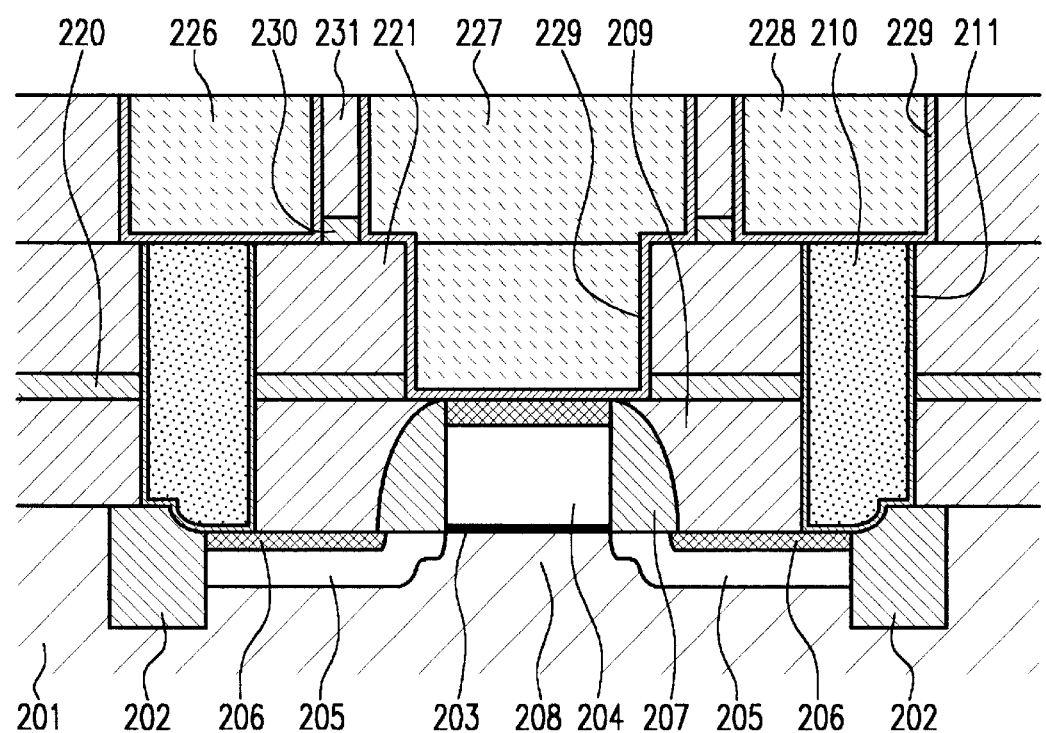

FIG. 2d schematically shows a cross-section of the final transistor 200 having a drain metallization line 226, a gate metallization line 227 and a source metallization 228. The respective metallization lines comprise a second barrier layer 229 at the interfaces to the adjacent materials.

Starting from the device as depicted in FIG. 2c, another opening is formed within a gate contact opening 225 above the gate electrode 204. This opening formed within the gate contact opening 225 extends at least partially along the width dimension of the transistor, i.e., into the page, and hence extends along a portion of the channel 208. Preferably, the opening above the gate electrode 204 is formed such that it extends at least along the entire width dimension of the channel 208. Next, the sidewalls of the opening above the gate electrode and the sidewalls of the gate contact opening 225 are covered with a barrier metal to form the second barrier layer 229. Subsequently, the opening and the gate contact opening 225 are filled with an electrically conductive material, preferably a metal such as copper, aluminum, tungsten, titanium, tantalum, cobalt, or any combination thereof. Preferably, filling of the opening above the gate electrode 204, of the gate contact opening 225 and of the drain and source contact openings 226 is carried out simultaneously. Thereafter, the residual electrically conductive material is removed by CMP to provide a planar surface of the structure.

It should be noted that although the gate contact 227 is illustrated as a T-shaped structure, any other appropriately shaped cross-section of the gate contact 227 may be used. For instance, the gate contact may exhibit a substantially uniform length along its entire depth, or, alternatively, the upper portion of the gate contact may have a length that is less than the length of the portion in contact with the gate electrode 204 so as to minimize cross-talk noise of the adjacent drain and source lines. In the configuration illustrated in FIG. 2d, preferably the dielectric layer 231 is comprised of a low k material to reduce the coupling capacitance between the drain, source, and gate metallization lines, thereby minimizing any cross-talk noise. Due to the extreme increase in the effective gate cross-section that is available for transferring a supplied gate voltage over the entire width of the gate electrode 204, the effective gate resistance is dramatically decreased, which in turn leads to a significantly reduced gate delay for the benefit of improved product speed performance, particularly when a low-k material is employed in the second dielectric layer stack. In a typical example of the present invention the lower portion is about 0.18 $\mu$m or less, whereas the upper portion of the gate metallization line is about 0.18 to about 0.36 $\mu$m for a typical gate length of 0.18 $\mu$m. The resistance of the gate electrode is in the range of about 0.1 to about 1.0 ohm and is thus significantly smaller than the resistance of 4 to 10 ohm of a typical prior art device having the same gate length.

Figure 2E:
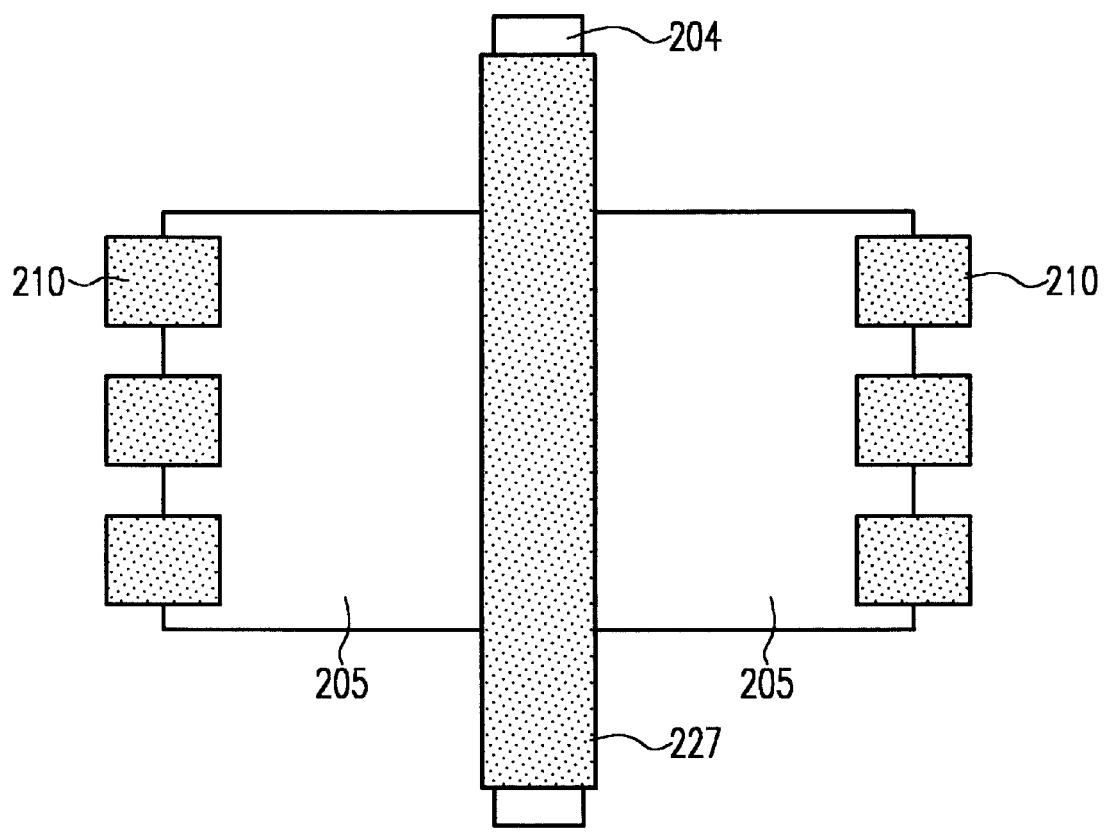

FIG. 2e schematically shows a top view of the transistor 200, wherein, for the sake of clarity, the first and second dielectric layer stacks, the dielectric layer 209, and the portions 206 are omitted. FIG. 2e shows the gate electrode 204 which extends in the transistor width dimension beyond the transistor active region comprising the drain and source regions 205. The drain and source contacts 210 provide electrical contact to the drain and source regions, respectively, and the gate contact 227 partially covers gate electrode 204 (in a transistor width direction). In this embodiment, the gate contact 227 extends at least along the entire width of the channel 208, not shown in FIG. 2e, and hence an extremely fast signal propagation is provided when a signal is applied to one of the end portions of the gate electrode 204. It should be noted, however, that even the extension of gate contact 227 over a portion of the channel width significantly decreases signal propagation time. Furthermore, from FIG. 2e it can be seen that the gate voltage is now supplied via the line of the gate contact 227 rather than via the silicide portion as in a conventional field effect transistor. Accordingly, the total gate resistance may therefore be reduced by about two orders of magnitude. Since the configuration in accordance with the present invention effectively de-couples the gate resistance from the gate length, a further downsizing of the gate length is possible without the disadvantages known from the conventional processing, thus clearly increasing the AC-to-DC performance gain ratio. Moreover, the present invention is not limited to FET devices fabricated on a silicon substrate, but may be employed in combination with any appropriate semiconductor material or with devices fabricated on any kind of substrate, such as SOI (silicon on insulator), glass substrates, and the like.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A field effect transistor formed on substrate, comprising:
    a drain region and a source region, spaced apart from each other in a transistor length dimension by a channel region;
    a gate electrode formed over the channel region and insulated therefrom by a gate insulation layer, the drain region, the source region, and the gate electrode extending substantially in a parallel manner along a transistor width dimension;
    a drain contact at least partially formed over the drain region and comprising a metal, the drain contact connecting the drain region to a drain metallization line;
    a source contact at least partially formed over the source region and comprising a metal, the source contact connecting the source region to a source metallization line; and
    a gate contact at least partially formed over and in contact with the gate electrode and comprising an electrically conductive material, wherein the gate contact has a width extension along the gate electrode in the transistor width dimension that contacts the gate electrode at least along a portion of the channel region, thereby providing a reduced gate electrode resistance.

2. The field effect transistor of claim 1, wherein the electrically conductive material comprises a metal.

3. The field effect transistor of claim 2, wherein the metal comprises at least one of the group consisting of copper, aluminum, tungsten, cobalt, tantalum, and titanium.

4. The field effect transistor of claim 1, wherein a lateral extension of the gate contact in the transistor length dimension exceeds a lateral extension of the gate electrode.

5. The field effect transistor of claim 1, wherein the width extension of the gate contact is equal to or larger than a width of the channel region.

6. The field effect transistor of claim 1, further comprising a gate metallization line formed over the gate contact for providing electrical connection to the gate electrode.

7. The field effect transistor of claim 6, further comprising respective insulating layers between the drain metallization line, the source metallization line, and the gate metallization line for electrically insulating the drain metallization line, the source metallization line, and the gate metallization line from each other, the respective insulating layers comprising a material having a dielectric constant that is less than 4.0.

8. The field effect transistor of claim 1, wherein the gate contact comprises at least one of copper, tungsten, aluminum, titanium, tantalum, and a combination thereof.

9. The field effect transistor of claim 1, wherein the gate contact comprises a metal barrier layer that is in contact with the gate electrode.

10. The field effect transistor of claim 1, wherein the gate electrode comprises a low resistance layer that is in contact with the gate contact.

11. The field effect transistor of claim 1, wherein the substrate is a semiconductor substrate.

12. The field effect transistor of claim 1, wherein the substrate is an insulating substrate with a layer of semiconductor material formed thereon.

13. The field effect transistor of claim 1, wherein said gate contact is in contact with said gate electrode at at least locations where said gate electrode is positioned above said channel region.

14. The field effect transistor of claim 1, wherein said gate contact is in contact with substantially an entire length of said gate electrode in a direction corresponding to said transistor width dimension.

15. A transistor wherein a channel region will be formed, comprising:
    a gate electrode positioned above a semiconducting substrate wherein a channel region for said transistor will be formed, said transistor having a width extending in a direction corresponding to a width of said channel region; and
    a gate contact positioned above and in contact with said gate electrode along at least a portion of said width of said gate electrode that is positioned above said channel region of said transistor.

16. The transistor of claim 15, wherein the gate contact is comprised of a metal.

17. The transistor of claim 16, wherein the metal comprises at least one of the group consisting of copper, aluminum, tungsten, cobalt, tantalum, and titanium.

18. The transistor of claim 15, wherein a lateral extension of the gate contact in a transistor length dimension exceeds a lateral extension of the gate electrode.

19. The transistor of claim 15, wherein the gate contact contacts said gate electrode along less than the entirety of the width of the channel region.

20. The transistor of claim 15, wherein the gate contact contacts said gate electrode along the entirety of the width of the channel region.

21. The transistor of claim 15, further comprising a gate metallization line formed over the gate contact for providing electrical connection to the gate electrode.

22. The transistor of claim 15, further comprising a source region and a drain region formed in said substrate adjacent said gate electrode.

23. The transistor of claim 15, wherein the gate contact comprises a metal barrier layer that is in contact with the gate electrode.

24. The transistor of claim 15, wherein the gate electrode comprises a low resistance layer that is in contact with the gate contact.

25. A transistor wherein a channel region will be formed, comprising:

a gate electrode positioned above a semiconducting substrate wherein said channel region for said transistor will be formed, said gate electrode having a width extending in a direction that corresponds to a width of said channel region; and a gate contact positioned above and in contact with said gate electrode for substantially the entirety of said width of said gate electrode that is positioned above said channel region of said transistor.

26. The transistor of claim 25, wherein the gate contact is comprised of a metal.

27. The transistor of claim 26, wherein the metal comprises at least one of the group consisting of copper, aluminum, tungsten, cobalt, tantalum, and titanium.

28. The transistor of claim 26, wherein a lateral extension of the gate contact in a transistor length dimension exceeds a lateral extension of the gate electrode.

29. The transistor of claim 26, further comprising a gate metallization line formed over the gate contact for providing electrical connection to the gate electrode.

30. The transistor of claim 25, further comprising a source region and a drain region formed in said substrate adjacent said gate electrode.

31. The transistor of claim 25, wherein the gate contact comprises a metal barrier layer that is in contact with the gate electrode.

32. The transistor of claim 25, wherein the gate electrode comprises a low resistance layer that is in contact with the gate contact.

* * * * *